(12) United States Patent
Galvagni

(10) Patent No.: US 6,963,493 B2
(45) Date of Patent: Nov. 8, 2005

(54) MULTILAYER ELECTRONIC DEVICES WITH VIA COMPONENTS

(75) Inventor: John L. Galvagni, Surfside Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 10/006,777

(22) Filed: Nov. 8, 2001

(65) Prior Publication Data

US 2003/0087498 A1 May 8, 2003

(51) Int. Cl.[7] .......................... H05K 7/02; H05K 7/06; H05K 7/08; H05K 7/10
(52) U.S. Cl. ...................... 361/782; 361/761; 361/763
(58) Field of Search ............................. 257/320–321, 257/379, 516, 528, 761, 763, 782

(56) References Cited

U.S. PATENT DOCUMENTS

| | | | |
|---|---|---|---|
| 4,349,862 A | | 9/1982 | Bajorek et al. |
| 4,567,542 A | * | 1/1986 | Shimada et al. ............. 361/321 |
| 4,787,853 A | | 11/1988 | Igarashi |
| 4,800,459 A | * | 1/1989 | Takagi et al. ................ 361/321 |
| 5,136,471 A | | 8/1992 | Inasaka |
| 5,225,969 A | | 7/1993 | Takaya et al. |
| 5,396,397 A | | 3/1995 | McClanahan et al. |
| 5,512,710 A | * | 4/1996 | Schroeder ................... 174/52.4 |
| 5,636,099 A | | 6/1997 | Sugawara et al. |
| 5,708,569 A | | 1/1998 | Howard et al. |
| 5,768,109 A | | 6/1998 | Gulick et al. |
| 5,888,627 A | * | 3/1999 | Nakatani ...................... 428/209 |
| 5,889,445 A | * | 3/1999 | Ritter et al. .................. 333/172 |
| 5,939,789 A | | 8/1999 | Kawai et al. |
| 6,241,838 B1 | * | 6/2001 | Sakamoto et al. ......... 156/89.17 |
| 6,400,008 B1 | * | 6/2002 | Farnworth ................... 257/698 |
| 6,471,525 B1 | * | 10/2002 | Fan et al. ...................... 439/70 |
| 6,486,529 B2 | * | 11/2002 | Chi et al. ..................... 257/531 |
| 2001/0038906 A1 | * | 11/2001 | O'Bryan et al. ............. 428/209 |
| 2002/0033378 A1 | * | 3/2002 | Hayashi et al. ............... 216/11 |
| 2002/0145203 A1 | * | 10/2002 | Adac-Amoakoh et al. .. 257/778 |

OTHER PUBLICATIONS

Metal Containing Polymer Based Composites . . . Applications, 1998, International Symposium on Microelectronics, 453-458.*
Electrical Behavior of Decoupling Capacitors . . . PCBs, 2001, IEEE Transactions on Electromagnetic Compatability, vol. 43, No. 4, 549-556.*
Fabrication of a fully integrated . . . processes, 2000, Journal of Materials Science, 455-460.*
Thin Film Passives . . . Electronics, 180-185.*

* cited by examiner

*Primary Examiner*—Mary Wilczewski
*Assistant Examiner*—Monica Lewis
(74) *Attorney, Agent, or Firm*—Dority & Manning, P.A.

(57) ABSTRACT

A method of using blind via to house electronic components within an electrical device is provided. Such a method allows for the vertical orientation of various types of passive components within a layer of a printed circuit board (PCB) or an integrated passive device (IPD). One exemplary embodiment of the method provides for the passive component's electrical connection between an embedded ground and another device on the surface of the PCB. By virtue of its component positioning, such a method reduces the space demands placed upon the surface of the PCB, enhances the flexibility of circuitry design, and allows for a greater variety of passive components and integral passive devices to be utilized within the PCB itself. Another exemplary embodiment of the method provides for greater flexibility in the design and manufacture of IPDs by allowing for the vertical electrical connection of various passive components through the placement of intervening passive components into via.

7 Claims, 11 Drawing Sheets

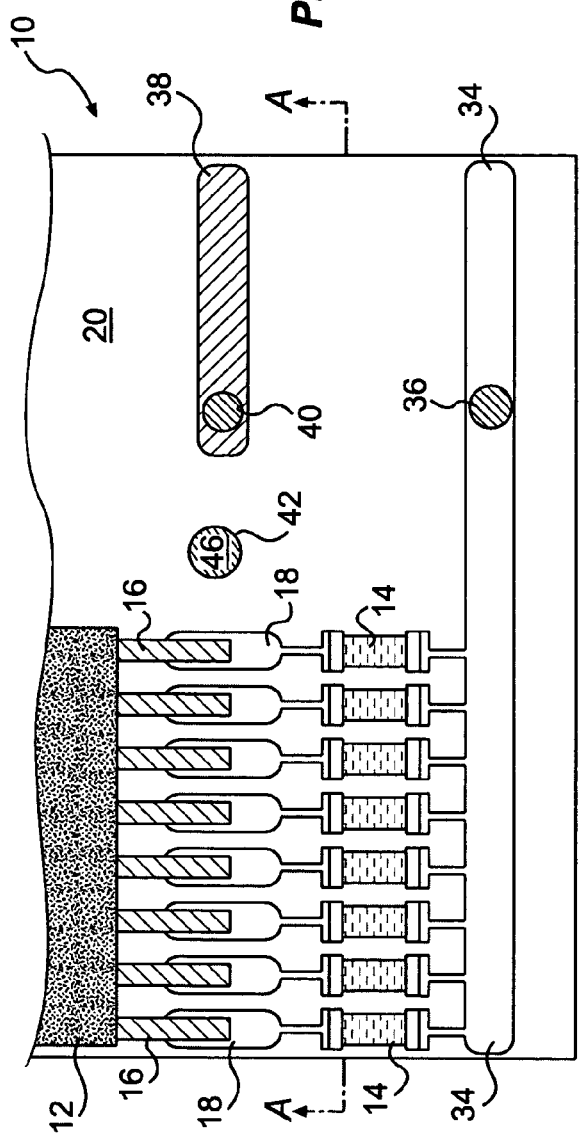
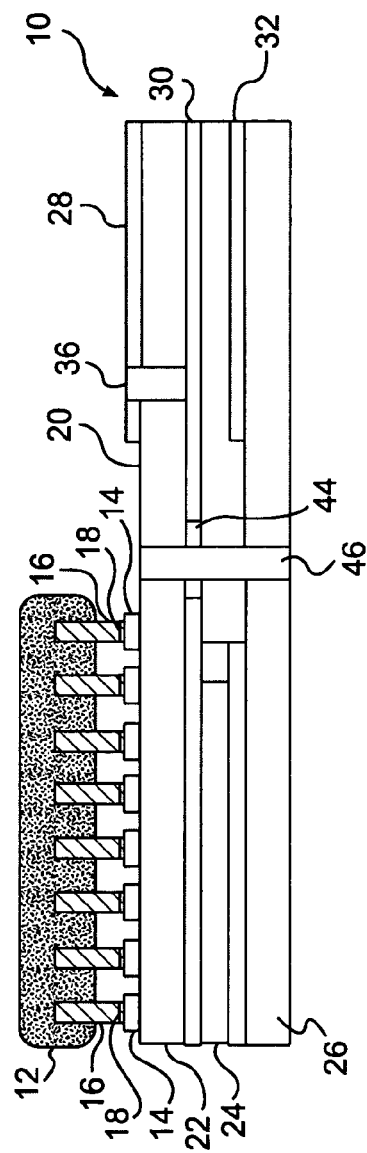
FIG. 1
PRIOR ART
FIG. 2
PRIOR ART

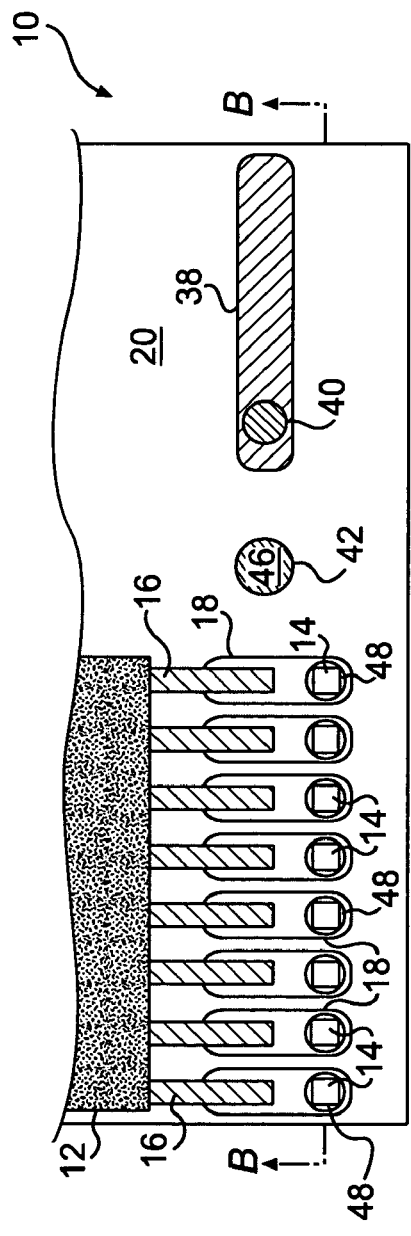
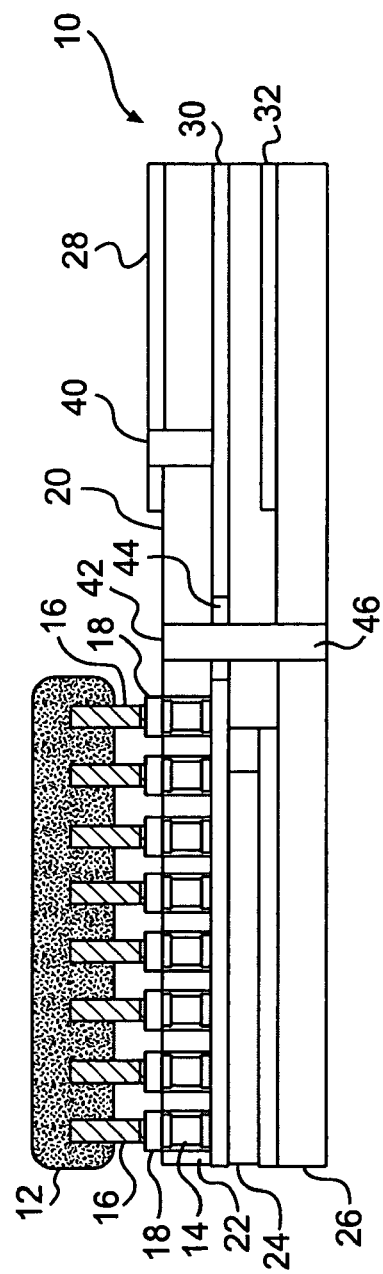

MULTILAYER ELECTRONIC DEVICES WITH VIA COMPONENTS

BACKGROUND OF THE INVENTION

The present invention relates to electrical connections made on printed circuit boards (PCBs) or within integrated passive devices (IPDs) for the purposes of connecting various electrical components. Specifically, the present invention relates to the use of vias to connect electronic components on and within multi-layer electrical devices, including IPDs. More specifically, the present invention relates to the use of blind vias to house electronic components in an effort to provide vertical electrical connections within electronic devices.

With the ever-increasing demand for additional features and the expectations of longer battery life in present day electronic devices, circuit and component designers have responded with smaller component designs requiring less voltage. The result has been not only an increase in device operation speed or operating frequency, but also an increase in package density. In addition to integrated circuitry, the use of multi-layered printed circuits has aided in reducing the space requirements of advanced circuitry for portable electronic devices.

In today's typical multi-layer printed circuit boards, the components, both active and passive, are soldered to the surface of the circuit board. Conductive paths are formed on the surface, usually by photolithography, and are connected by conductive vias to internal conductors, which form a complex series of three-dimensional interconnections.

As a result of the reduction in relative sizes, however, a point has been reached where the components themselves are difficult to handle and the lands to which they must be attached have not been capable of a comparable reduction in size. Further, the available line and space widths of the conductive paths have reached a practical limit of about 5–10 mils, without going to special, and expensive high density processing.

In an attempt to resolve these problems, two main approaches have been undertaken: first, designers have begun using integrated passive devices (IPDs) in which multiple passive components are incorporated into a single package for positioning within the circuit. Second, designers have incorporated special layers within the circuit board itself to provide capacitive and resistive functions, which may be customized as required. These approaches serve only to save space on the surface of the PCB itself Unfortunately, neither of these two approaches solves both the need for space savings and increased flexibility in introducing components other than capacitors and resistors into the PCB or IPD. For example, the use of an IPD on a PCB is not attractive where its design would require significant re-routing of the surface traces thus off-setting the intended space savings. Additionally, it is inevitable that when multiple components are placed within the same package there will be parasitics that occur. These are detrimental to the performance of the device.

Further, integrated passive devices are currently limited to providing only capacitive and resistive functions. Such a limitation fails to address the need to save space regardless of the component's function. Finally, there are economic limitations to the use of IPDs. For instance, as a custom product, integrated passive devices are a long-delivery item which increase both cost and manufacturing time of a product. Still further, in the electronics industry, customers of component manufacturers are loath to spend mote money on an unproven multi-component device as opposed to individual components with proven reliability, and tight parametric tolerances.

Similarly, the use of buried layers within the circuit board itself has numerous drawbacks. The range of available capacitive and resistive values available in the buried layers is limited and they must be preset. Additionally, the sculpting of these layers is a very cost and time-intensive process which is currently beyond the capabilities of most PCB manufacturers. For example, the board manufacturers are used to dealing with board layers of at least 250 microns while the thickness of a buried capacitive layer would need to be on the order of 50 microns or smaller to be effective. Additionally, because of their being so thin, such a layer is very fragile. Any breakage would result in an electrical fault and would require the board to be scrapped.

During further finishing of the PCB, such layers may be subjected to intense heat or other treatments required for completing the manufacturing process. Because of this treatment, the capacitive and resistive values of the layers may be inadvertently altered from the desired preset values of the layers. The PCB would then be unable to effectively operate as designed.

SUMMARY OF THE INVENTION

The present invention recognizes and addresses various of the foregoing limitations and drawbacks, and others, concerning a method of using a via to house an electronic component. Therefore, the present invention provides a method for using a blind via for housing and allowing electrical connection of a passive electronic component within a layer of either a printed circuit board or an integrated passive device.

It is, therefor, one aspect of the subject invention to provide a method for reducing the space demands on the surface of a PCB. More particularly, it is an aspect of the present invention to provide a method of using a via to house an electronic component within a layer of a printed circuit board thus reducing the space demands on the surface of the PCB.

It is yet another aspect of the present invention to provide a method of housing an electronic component in a via such that vertical electrical connection is made between adjacent components and/or buried conductors. In such context, it is a further aspect of the present invention to provide a method of producing a vertical electrical connection between a passive electronic component and both an active component and a buried conductor.

It is still another aspect of the present invention to provide a method of using a via to house an electronic component in which such method allows for greater flexibility in using integrated passive devices on printed circuit boards. In such context, it is a further aspect of the present invention to provide such a method in which resistors, capacitors, varistors, thermistors or other passive components may be housed within such a via within a layer of the PCB itself.

An additional aspect of the present invention includes providing a method for housing an electronic component in a blind via so as to reduce production costs of typical PCBs. In such context, it is a further aspect of the present invention to provide such a method that additionally provides greater yields (i.e., ranges of component values), greater flexibility in design due to space-savings and the opportunity to utilize a greater variety of components within the design.

It is still a further aspect of the present invention to provide a method for increasing the flexibility of integrated passive devices. More particularly, it is an aspect of the present invention to provide a method of using vias to house electronic components between layers within an integrated passive device.

It is yet another aspect of the present invention to provide a method of using a via to house an electronic component in which such method allows for greater flexibility in the design and manufacture of integrated passive devices.

Additional aspects and advantages of the invention are set forth in, or will be apparent to those of ordinary skill in the art from the detailed description that follows. Also, it should be further appreciated that modifications and variations to the specifically illustrated and discussed steps, features and materials hereof may be practiced in various embodiments and uses of this invention without departing from the spirit and scope thereof, by virtue of present reference thereto. Such variations may include, but are not limited to, substitutions of equivalent steps, means, features, and materials for those shown or discussed, and the functional or positional reversal of various parts, features, or the like.

Still further, it is to be understood that different embodiments, as well as different presently preferred embodiments, of this invention, may include various combinations or configurations of presently disclosed steps, features, elements, or their equivalents (including combinations of steps, features or configurations thereof not expressly shown in the figures or stated in the detailed description).

These and other features, aspects and advantages of the present invention will become better understood with reference to the following description and appended claims. The accompanying drawings, which are incorporated in and constitute a part of this specification, illustrate an embodiment of the invention and, together with the description, serve to explain the principles of the invention.

The present invention is directed toward a method for using a via to house an electronic component, generally a passive component, within a layer of an electrical device in such a manner as to allow vertical electrical connection between the component and other elements of the device. In particular, one embodiment of the present invention provides for the use of blind vias to house passive components, which may be electrically connected to both an embedded ground plane located within the PCB and active components located on an outer surface of the PCB.

Another embodiment of the present invention is directed toward a method for using vias to house electronic components, which may be electrically connected to other passive components within an integrated passive device in such a manner as to allow vertical electrical connection between the component and other of the elements within the device.

BRIEF DESCRIPTION OF THE DRAWINGS

A fill and enabling disclosure of the present invention, including the best mode thereof, directed to one of ordinary skill in the art, is set forth in the specification, which makes reference to the appended figures, in which:

FIG. 1 is an overhead view of a portion of a typical printed circuit board using horizontal electrical connections between an active and multiple passive components;

FIG. 2 is a cross-section view taken along line A—A of the printed circuit board as shown in FIG. 1;

FIG. 3 is an overhead view of a portion of a printed circuit board with electrical connection between an active and multiple passive components in accordance with the present invention;

FIG. 4 is a cross-section view taken along line B—B of the printed circuit board as shown in FIG. 3;

Figure 5:
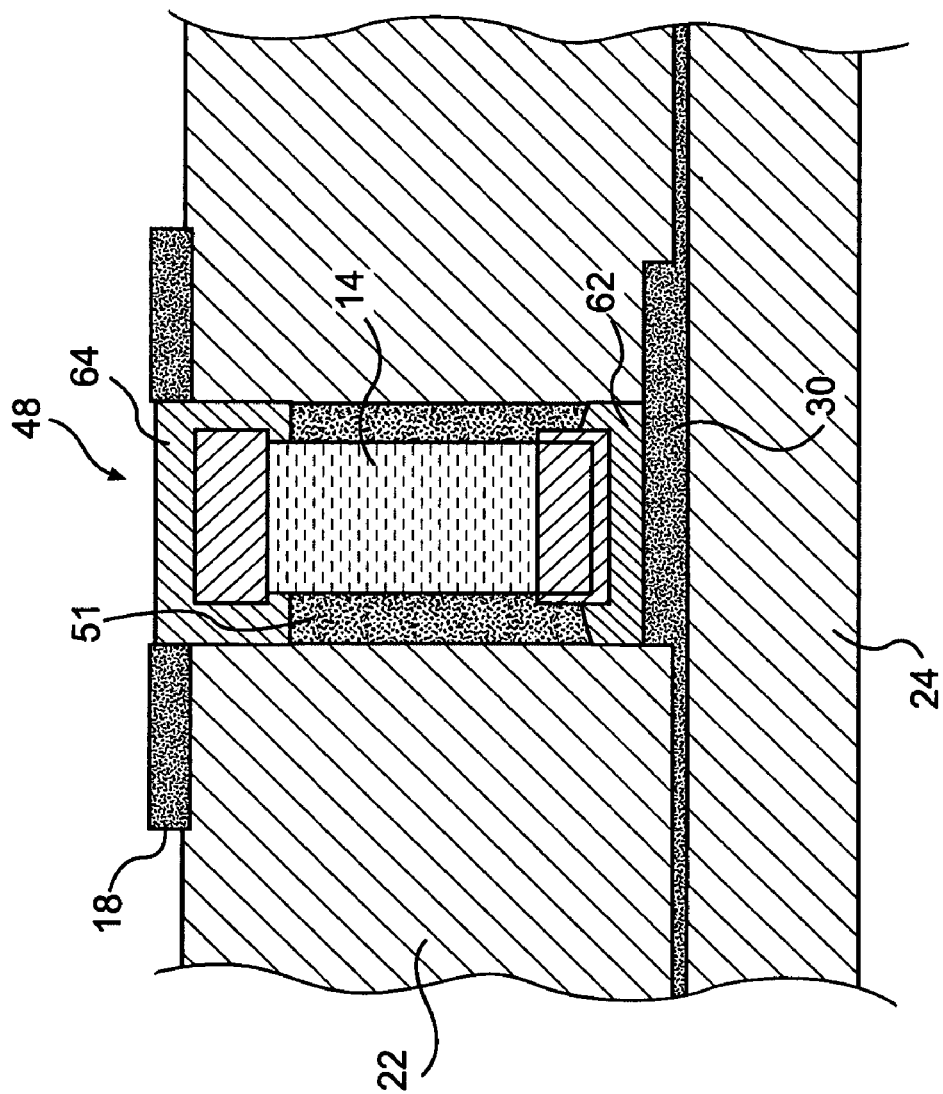
FIG. 5 is an exemplary enlarged cross-section view of an electronic component placed in a via in accordance with the present invention.

Repeat use of reference characters throughout the present specification and appended drawings is intended to represent the same or analogous features or elements of the invention.

DETAILED DESCRIPTION OF THE PREFERRED EMBODIMENT

Reference will now be made in detail to presently preferred embodiments of the invention, examples of which are fully represented in the accompanying drawings. Such examples are provided by way of an explanation of the invention, not limitation thereof. In fact, it will be apparent to those skilled in the art that various modifications and variations can be made in the present invention, without departing from the spirit and scope thereof. For instance, features illustrated or described as part of one embodiment can be used on another embodiment to yield a still further embodiment. Still further, variations in selection of materials and/or characteristics may be practiced, to satisfy particular desired user criteria. Thus, it is intended that the present invention cover such modifications and variations as come within the scope of the present features and their equivalents.

As disclosed above, the present invention is particularly concerned with a method for housing an electronic component within a via in order to reduce the space demands placed on either the surface of a printed circuit board or to enhance the flexibility of electrical connections between components within an integrated passive device.

An overhead planar view of a typical printed circuit board 10 (PCB) using known design concepts is shown in FIG. 1. Generally, such PCBs serve as substrates to support integrated circuits comprising both active 12 and passive 14 components that are electrically connected by leads 16 to lands 18 on a surface 20 of the PCB 10. Such electrical connections are made most often by soldering the integrated circuit component's leads 16 to the lands 18 on a surface 20 of the PCB 10.

FIG. 2 shows a cross-sectional view of the PCB in FIG. 1, in which the PCB 10 comprises multiple non-conductive laminae 22, 24 and 26 between which various patterned conductive layers 28, 30 and 32 exist. One of ordinary skill in the art would recognize this multi-layer PCB 10 as typical of the current PCBs in use throughout the electronics industry. The materials and patterns used to construct such laminae 22, 24 and 26 and embedded conductive layers 28, 30 and 32 are well known to one of ordinary skill in the art and form no particular aspect of the present invention. However, it should be noted that any of the known materials and methods of forming either the laminae 22, 24 and 26 or the embedded patterned conductive layers 28, 30 and 32 may be used in the present invention.

For illustrative purposes only, presume embedded conductive layers 28 and 32 are for carrying signals from one portion of the circuitry to another. Similarly presume, however, that conductive layer 30 is a ground plane. In the present constructs, there typically may exist between each land 18 and the ground plane 30 at least one passive component 14.

As can be seen in FIG. 1, which has been greatly simplified for explanatory purposes only, there exist eight passive components 14, one between each land 18 and the ground plane 30. Each passive component 14 is additionally connected to a ground, shown here as trace 34. Trace 34 exists on an upper surface 20 of the printed circuit board 10. The ground trace 34 is connected to the embedded ground plane 30 by way of a hole or via 36 through both the ground trace 34 and at least one of the non-conductive layers 24 of the PCB 10.

Using present design techniques, it is in this manner that both active 12 and passive 14 components are generally connected to a buried ground plane 30 in order to aid in the elimination of random noise, interference or extraneous voltages from the circuit. As can be seen, however, such a design layout places greater physical space demands on the upper surface 20 of the PCB 10 itself. Additionally, as the circuit designs become more and more complex the need for additional space dedicated to connectivity areas (i.e., lands) can only increase.

Secondary structures are also represented in FIG. 1. Additional traces 38 may also be connected to the ground plane 30 by way of a hole or via 40. In some cases a via 42 may pass through all of the laminae 22, 24 and 26 and the patterned conductive layers 28, 30 and 32 to connect circuitry on opposing faces of the PCB. In such an instance, as shown here, there may be an opening 44 through the ground plane 30 to prevent any contact by the electrically conductive connecting means 46 therein with the ground plane 30 itself as such contact would result in a short circuit.

In one exemplary embodiment of the present invention, as shown in FIGS. 3 and 4, a printed circuit board 10 is acting to support an integrated circuit constructed in accordance with the present invention. As before, the integrated circuit may be comprised of a plurality of active 12 and passive 14 components connected electrically by soldering the component leads 16 to lands 18 on a surface 20 of the PCB 10. FIG. 4 shows a cross-sectional view of the PCB 10 in FIG. 3 constructed in accordance with the present invention, in which the printed circuit board 10 comprises multiple non-conductive laminae 22, 24 and 26 between which various patterned conductive layers 28, 30 and 32 exist.

Unlike the typical PCB construction as shown in FIGS. 1 and 2, the present PCB 10 and integrated circuit instead houses the passive components 14 in a blind via 48 within non-conductive layer 22 of the PCB 10. In this preferred exemplary embodiment of the present invention, the use of such vias 48 is limited to non-conductive layer 22. It should be noted, however, that the present invention does not limit integration of passive components 14 within the printed circuit board 10 to only the upper non-conductive layer 22. Further, such integration of components reduces demand for space on the surface 20 of the PCB 10.

As a result of this integration into the PCB, the passive components 14 are mounted in a vertical orientation in relation to the surface 20 of the PCB 10. It would be obvious to one of ordinary skill in the art that the surface trace 34 is no longer required to connect each passive component 14 to the via 36 and on to the embedded ground plane 30. Instead, by virtue of their vertical orientation, the passive components 14 are now directly adjacent the ground plane 30 and may be electrically connected thereto.

In order to accommodate the passive components 14 into the nonconductive layer 22, preparation of the blind via 48 must take place during the manufacturing of the PCB 10 itself. Generally, all of the unique features of each non-conductive layer 22, 24 and 26 of the PCB 10 are formed prior to their being brought together to form the PCB 10. Each via is drilled into and each of the patterned conductive layers 28, 30 and 32 is formed on the upper surface of its respective non-conductive layer 22, 24 and 26 prior to their being stacked to form the PCB 10.

The passive elements 14 may be placed into a via 48 in their vertical orientation and soldered to the underlying ground plane 30 using a high temperature solder or connection may be made by virtue of a conductive epoxy material 62. This will aid in preventing any undesired effects subsequent soldering may have to these connections when connecting the "upper" termination of the passive components 14 to the lands 18.

The exemplary non-conductive layer 22 into which the blind via 48 are drilled is typically a rigid epoxy preimpregnated material, such as FR4, an epoxy-fiberglass composite. The choice of such material is in part designed to ensure that the vias 48 drilled before the various laminea 22, 24 and 26 are stacked, do not collapse before the introduction of the passive components 14 therein. In the present invention, closure of such vias upon exposure to the increased heat from the PCB formation process or from the connection process between the ground plane 30 and the passive components 14 (i.e., a high temperature soldering process) may serve a beneficial purpose. Such a process would seal the passive components 14 in place and prevent any solder from entering vias 48 during further completion of the circuit's construction. Preventing the introduction of additional solder into vias 48 is important, as it should be noted that unlike the vias of FIGS. 1 and 2, the walls of vias 48 are not conductive thus preventing any connectivity problems with the circuitry. Under certain circumstances, the epoxy material forming the various laminea 22, 24 and 26 can be made to flow and seal in the edges of the components 14 in the vias 48. This would prevent any subsequent solder from running down the sides of the vias 48 and shorting out the component.

Still further, the lands 18 are generally designed utilizing a thick-film technique to allow for the components 12 and 14 to be soldered in their normal configuration. With the presently preferred embodiment, the use of thin-film terminations on the ends of the components 12 and 14 would still allow reliable and sufficient electrical connection by way of a typical lower temperature solder connection and would be preferred due to their reduction in the cost of manufacturing of the PCB 10 and its associated circuitry.

FIG. 5 provides an enlarged view of an exemplary passive component 14 as mounted in a via 48 in accordance with the present invention. As can be seen, the passive component 14 is electrically connected to the ground plane 30 by way of either a solder or conductive epoxy material 62. The remainder of the open area in the via 48 may be filled with a non-conductive filler material 51 or under certain circumstances the material constituting exemplary non-conductive layer 22 may be made to partially melt and flow into the via 48 to partially seal it. Finally, connecting the upper portion of the passive component 14 to its respective land 18 creates the top conductor 64.

In still a further preferred embodiment of the present invention, FIGS. 6–13 show the use of a blind via 148 to house electrically connected passive components 114 within an integrated passive device 150. In such an embodiment, the vias 148 contain various passive components 114 as discussed above which serve in addition to their electrical functions as connections between other of the passive components comprising the device 150. In this manner, the footprint of an IPD may be reduced while providing greater flexibility in its design layout.

Figure 6:
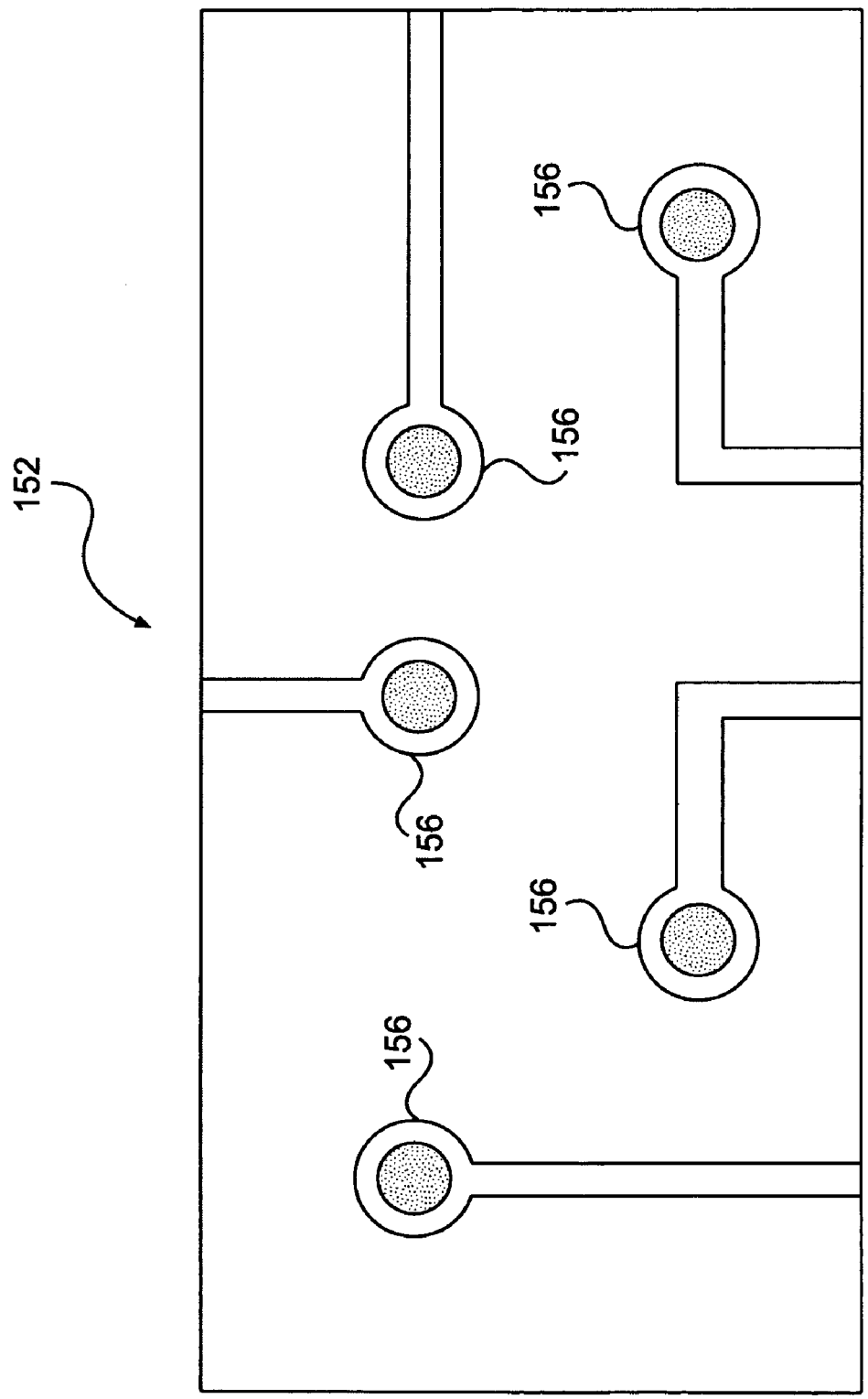
FIG. 6 is an overhead view of an exemplary layer of an integrated passive device in accordance with the present invention providing a portion of the device's circuitry and capture pads for electrical connection to other components of the device.
Figure 7:
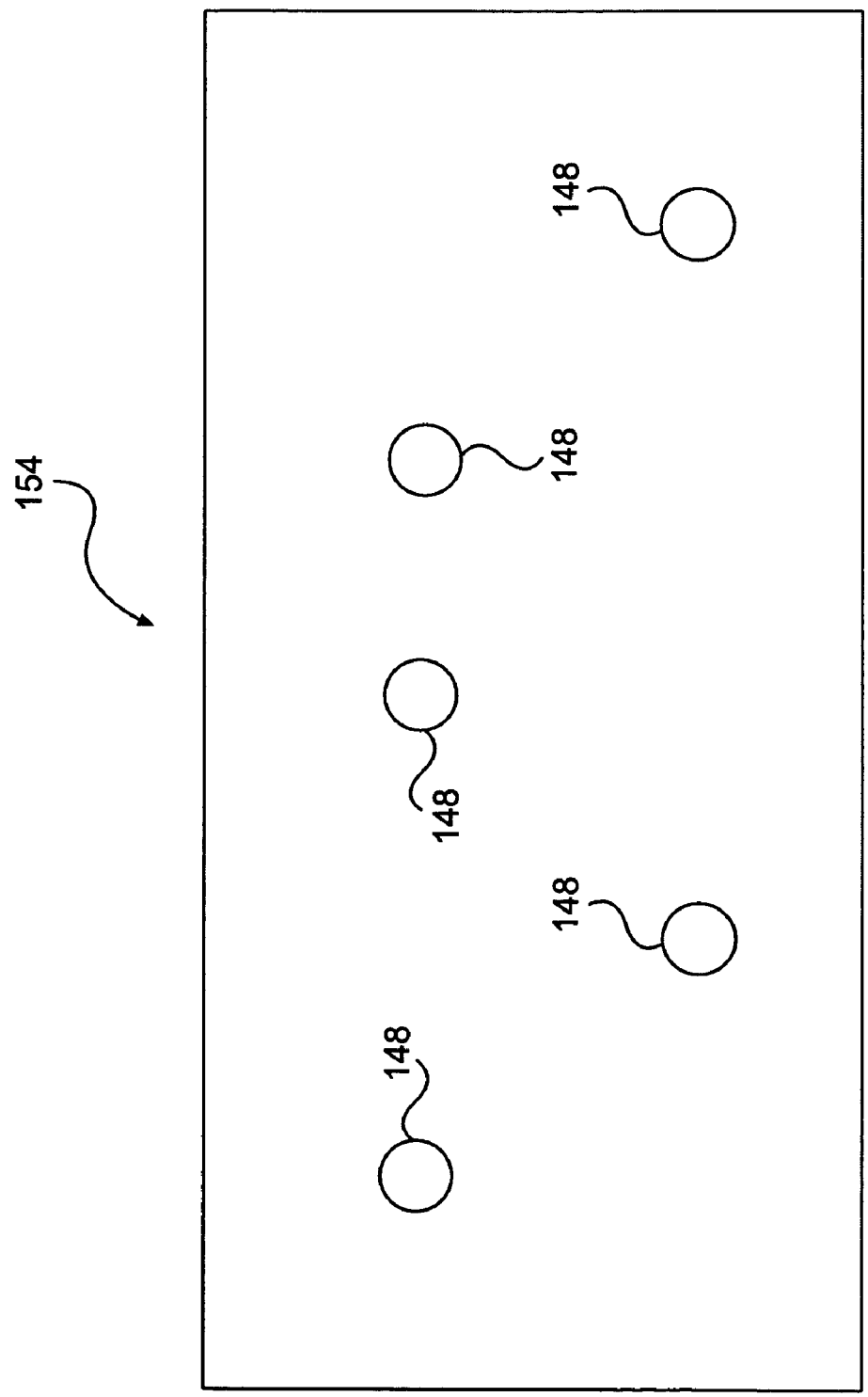
FIG. 7 is an overhead view of an exemplary layer of an integrated passive device in accordance with the present invention that has vias drilled therethrough.

In particular, the two non-conductive layers 152 and 154 of the IPD shown in FIGS. 6 and 7 represent the basic skeletal construction of an exemplary IPD. The first non-conductive layer 152, as shown in FIG. 6, is a typical multilayer green ceramic pad with various circuitry and capture pads 156 on an upper surface thereof. The capture pads 156 are for electrical connection to other components within the device 150. FIG. 7 shows the second such non-conductive layer 154 with a plurality of vias 148 drilled therethrough. In particular, each via 148 corresponds to a respective capture pad 156 from the first non-conductive layer 152.

Figure 8:
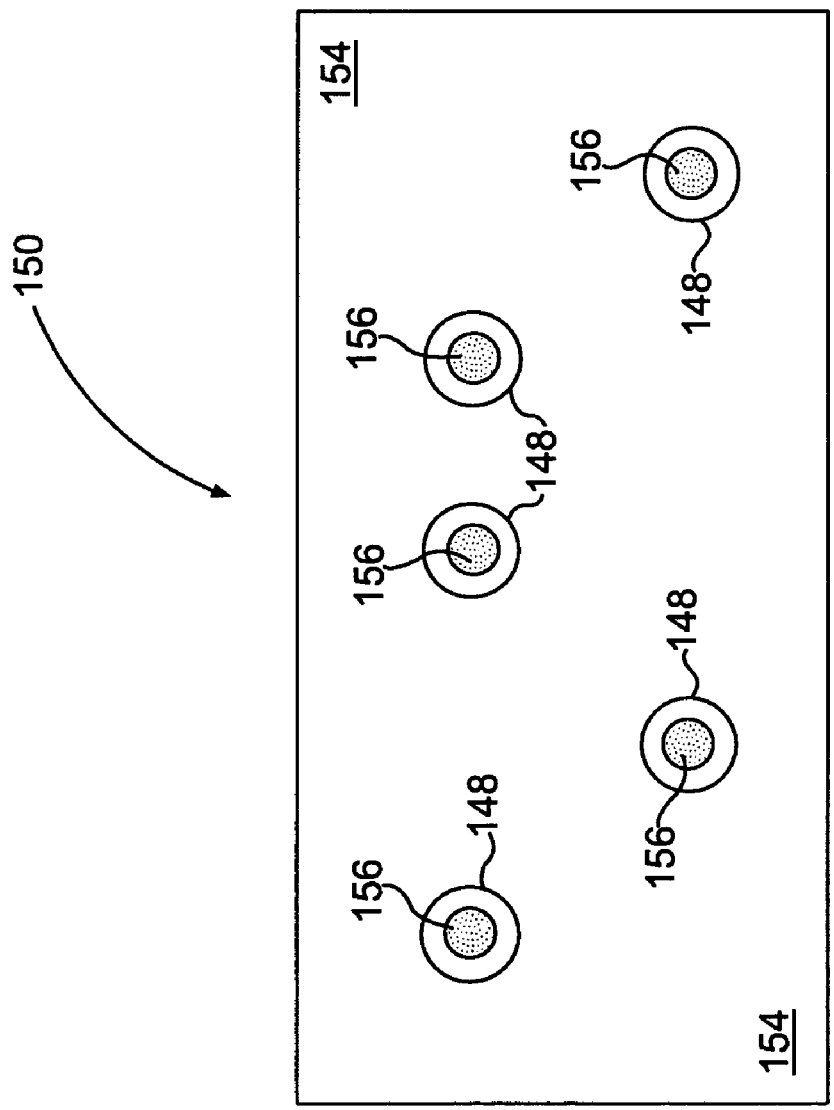
FIG. 8 is an overhead view of a bonded combination of the layers from FIGS. 6 and 7 showing the corresponding vias and capture pads and generally representing an exemplary skeletal structure of an integrated passive device made in accordance with the present invention.

As can be seen in FIG. 8, the second layer 154 is bonded to the upper surface of the first layer 152 embedding the circuitry thereon in between the layers 152 and 154. The vias 148 however, allow electrical connection to such circuitry by way of the capture pads 156. In bonding the two layers 152 and 154 together, it should be noted that any of a number of known methods may be used to make the layers 152 and 154 an essentially unitary body 150, including: lamination, weight-firing, spritzing a solvent or using the slip as glue.

Figure 9:
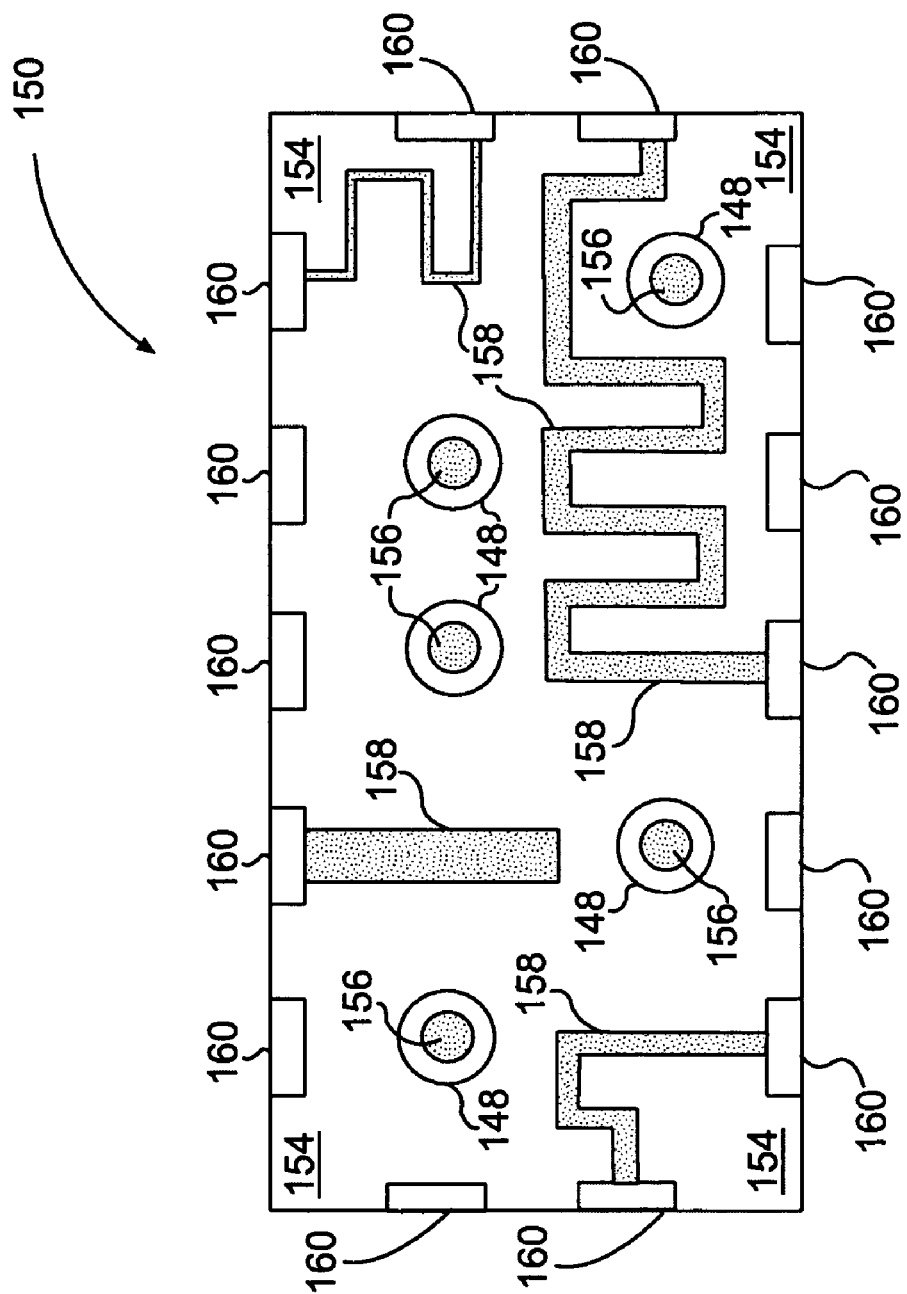
FIG. 9 is an overhead view of the IPD of FIG. 8 with additional exemplary resistor/conductor patterns placed on an outer surface of the IPD and band terminated edges.

With the basic construction of the device's skeletal frame 150 completed, as can be seen in FIG. 9, the manufacturer is now able to form the additional resistive/conductive patterns 158 required on an outer surface of the device and band terminate the edges to provide terminations 160 for such device. The methods of making such patterns 158 and terminations 160 are varied but generally known in the art. They form no particular aspect of the present invention and therefore will not be explained in detail.

Figure 10:
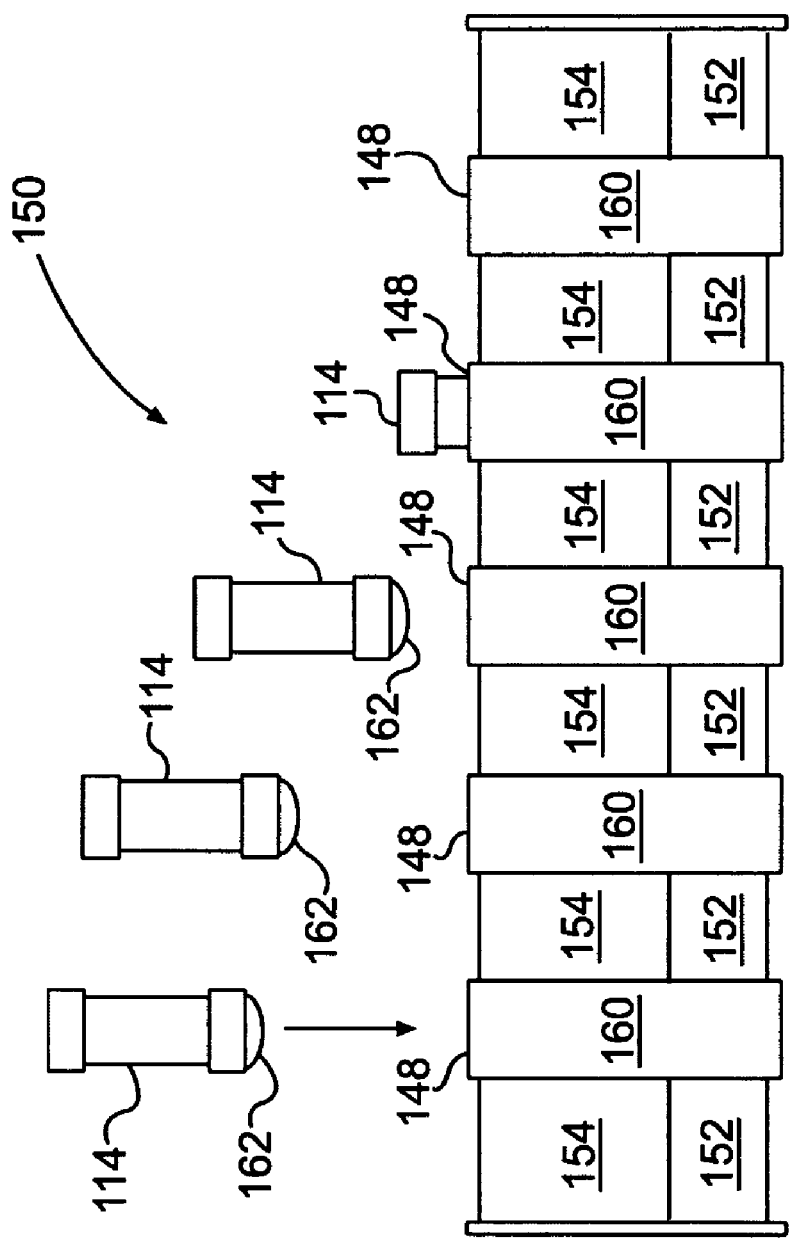
FIG. 10 is a side view of the IPD of FIG. 9 showing the introduction of the vertically oriented passive components into their respective via for electrical connection to the capture pads on the IPD layer of FIG. 6.
Figure 11:
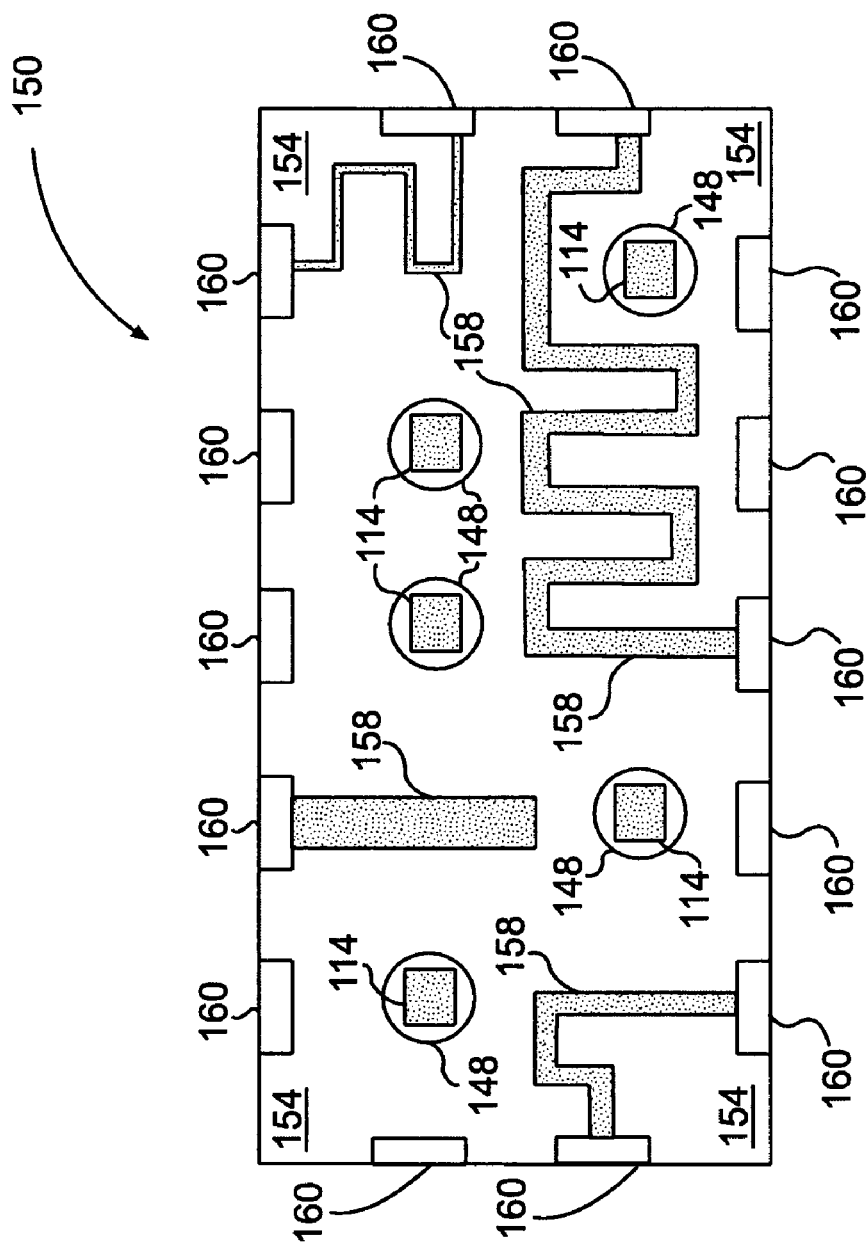
FIG. 11 is an overhead view of the IPD of FIG. 8 including the passive components in their respective via.
Figure 12:
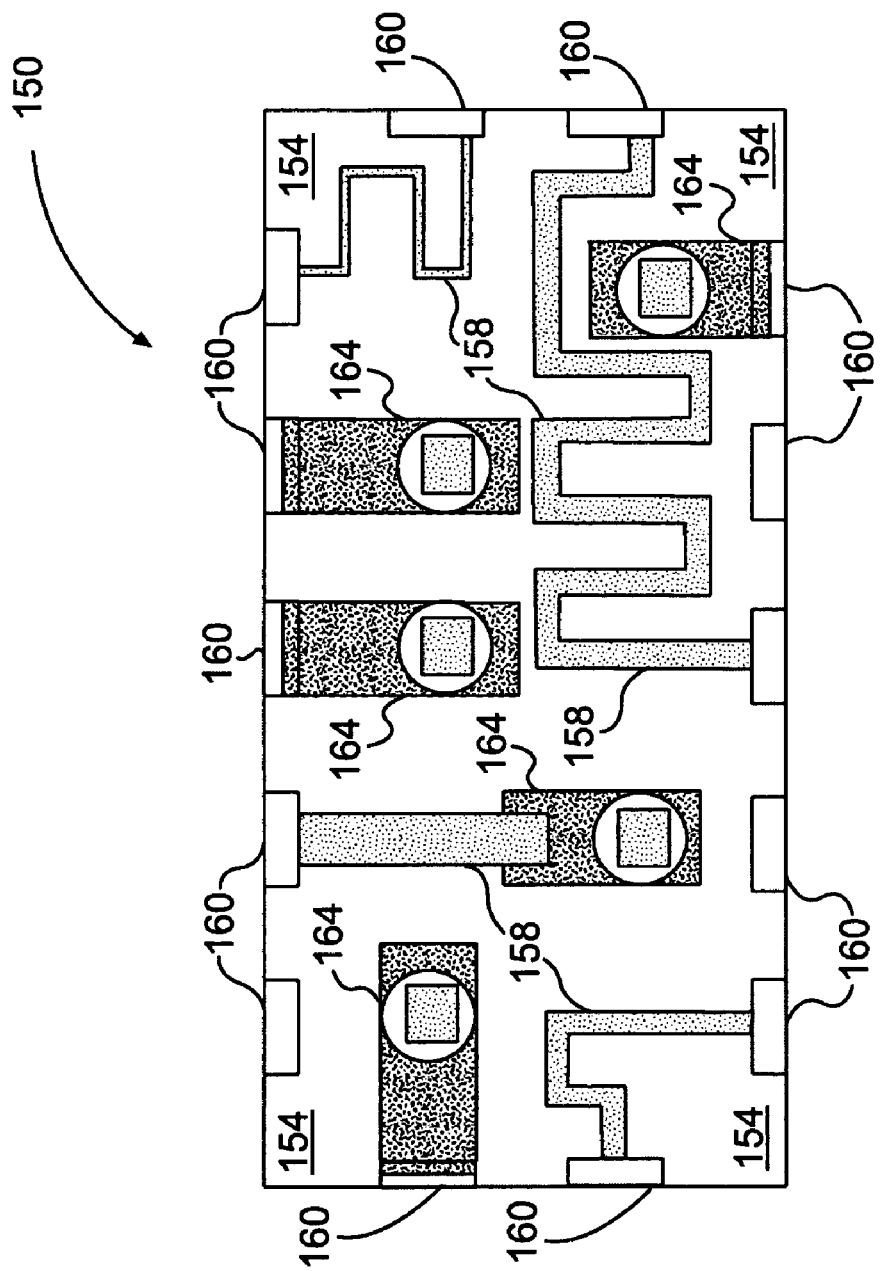
FIG. 12 is an overhead view of the IPD of FIG. 11 showing the top contacts connecting the via-located passive components with their respective terminations or resistive/conductive elements.

FIG. 10 depicts the inclusion of the internal passive components 114 into the vias 148 to provide the electrical connection between the embedded circuitry on the first layer 152 and that on the outer surface of the device 150. Each passive component 114 will be pre-selected for its performance characteristics and will ultimately be permanently embedded within the vias 148. To provide a stable electrical connection with their respective capture pads 156, the lower end of each passive component may be dipped in either a solder paste or a conductive epoxy 162 which is either cured or through the technique of reflow permanently affixed to the contact pad 156 thus forming the bottom contact for the passive component 114. FIG. 11 shows the passive components 114 located within their respective vias 148.

In order to ensure both the electrical and physical stability of the passive component 114, the vias 148 may be filled with an insulating epoxy 166 or other similar material to partially encase the passive component 114 and hold it in place. As discussed above and as seen in FIG. 13, if the conductor patterns have been formed either by thin-film plating or thick-film printing, the electrical connection to the upper conductor 164 may then be formed by filling in the remaining portion of the via 148 either with a conductor or a solder paste 118 and either cure or reflow it, respectively.

Alternatively, if the upper conductors 164 for electrical connection to the via-located passive components 114 have not yet been formed, the manufacturer may choose to screen the conductors 164 and allow the excess material to flow into the remaining space in the partially filled vias 148 to generate the electrical connection between the passive components 114 and the upper conductors 164.

Figure 13:
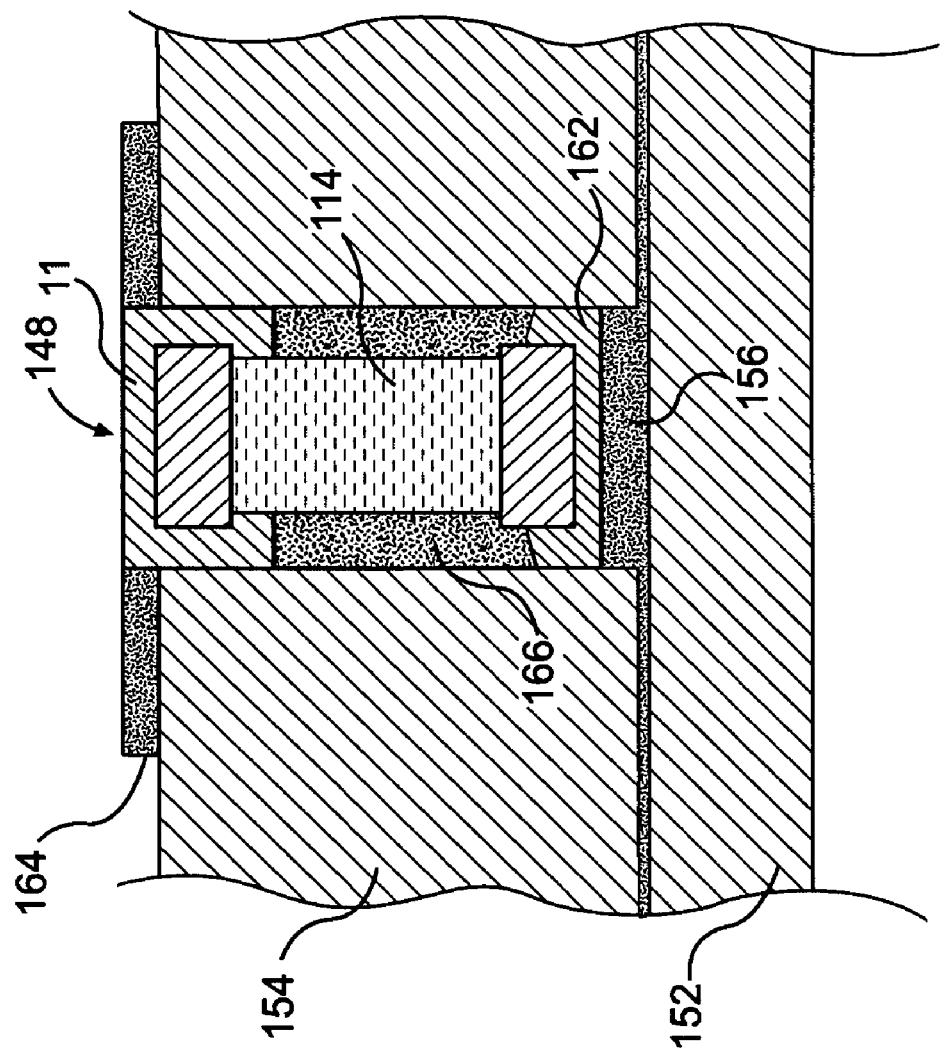
FIG. 13 is an exemplary enlarged cross-sectional view of one of the via-located electronic components of FIG. 12 in accordance with the present invention.

As does FIG. 5, FIG. 13 provides an enlarged view of a via-located passive component 114 as mounted in an IPD 150. As before, the passive component 114 is permanently affixed to its respective capture pad 156 through the use of either a solder or conductive epoxy material 162 and then the manufacturer either reflows or cures it, respectively. An insulating epoxy 166 may then be used as a filler material in the via 148 to partially seal it. Finally, the passive component 114 may be electrically connected to the upper conductors 164 as described above.

Although multiple preferred embodiments of the invention have been described using specific terms and devices, such description is for illustrative purposes only. The words used ate words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred versions contained herein.

What is claimed is:

1. A multi-layer electronic device comprising:
  a plurality of first device layers, each such layer having a first series of resistive/conductive patterns thereon and a plurality of via drilled therethrough;
  a plurality of second device layers, each such layer having a plurality of via drilled therethrough;
  wherein said first and second device layers comprise an epoxy-fiberglass composite material;
  a unitary device body formed by the bonded union of an interleaved stack of said plurality of first and said second device layers, wherein each of said via correspond to a respective portion of the resistive/conductive patterns on the underlying device layer and wherein one of said second device layers forms the uppermost device layer and the lowermost device layer is one of said first device layers;
  a second series of resistive/conductive patterns on an outer layer of said uppermost device layer;
  a plurality of terminations on said unitary device body for electrical connection between other electronic devices and various of the resistive/conductive patterns throughout said unitary device body;

individual passive components with respective first and second opposing terminations, wherein each individual passive component is vertically mounted into a selected of said plurality of via and wherein one of said first and second opposing terminations are electrically connected to a portion of said underlying first device layer's first series of resistive/conductive patterns;

multiple portions of a non-conductive material respectively substantially filling the spaces defined by respective vias between each of said individual passive components and said second device layers, wherein said non-conductive material partially encases each said individual passive component to hold it in place while leaving one of said first and second opposing electrical terminations exposed and prevents shorting between respective first and second opposing electrical terminations; and an electrical connection between each of said passive components and at least a portion of said overlying first device layer's first series of resistive/conductive patterns through a corresponding one of said first device layer's plurality of via.

2. The multi-layer electronic device of claim 1, wherein said first and second device layers comprise FR4.

3. The multi-layer electronic device of claim 1, wherein said bonded union of the interleaved stack of said plurality of first and said second device layers is formed of one of lamination, weight-firing, gluing and spritzing solvent.

4. The multi-layer electronic device of claim 1, wherein said passive components are bonded to their respective capture pads by way of solder reflow.

5. The multi-layer electronic device of claim 1, wherein said passive components are bonded to their respective capture pads by way of cured conductive epoxy.

6. The multi-layer electronic device of claim 1, wherein said passive components comprise any combination of resistors, capacitors, varistors, and thermistors.

7. The multi-layer electronic device of claim 1, wherein said multiple portions of non-conductive material comprise insulative epoxy.

* * * * *